United States Patent
Amada

(10) Patent No.: US 7,804,310 B2
(45) Date of Patent: Sep. 28, 2010

(54) CURRENT DETECTION CIRCUIT AND CURRENT DETECTION METHOD

(75) Inventor: Kenji Amada, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 180 days.

(21) Appl. No.: 12/232,070

(22) Filed: Sep. 10, 2008

(65) Prior Publication Data

US 2009/0079415 A1     Mar. 26, 2009

(30) Foreign Application Priority Data

Sep. 26, 2007     (JP)     ............................. 2007-249973

(51) Int. Cl.
*G01R 27/08* (2006.01)
*G01R 31/08* (2006.01)
*G01R 19/00* (2006.01)

(52) U.S. Cl. .................... 324/713; 324/522; 324/76.11

(58) Field of Classification Search .................. 324/522, 324/713, 76.11, 71.1, 348; 361/30, 31, 57, 361/63, 65, 79, 87; 340/636.12, 636.13, 340/664; 702/64; 323/277, 316
See application file for complete search history.

(56) References Cited

U.S. PATENT DOCUMENTS

| 4,827,207 | A | * | 5/1989 | Chieli ........................ 323/316 |
| 5,594,271 | A | * | 1/1997 | Iwata et al. .................. 257/469 |
| 5,959,464 | A | * | 9/1999 | Qualich ....................... 324/769 |
| 7,557,557 | B2 | * | 7/2009 | Sugie et al. .................. 323/316 |

FOREIGN PATENT DOCUMENTS

JP     2003-28901     1/2003

* cited by examiner

*Primary Examiner*—Hoai-An D Nguyen
(74) *Attorney, Agent, or Firm*—McGinn IP Law Group, PLLC

(57) ABSTRACT

A multi-source MOS transistor includes a sense MOS transistor and a load MOS transistor, and is connected to a load. A current detection portion has a negative input offset voltage characteristic, and detects a first sense current in a state where it is connected to the power supply and the sense MOS transistor and a second sense current in a state where it is connected to the sense MOS transistor and the load MOS transistor. A calculation control portion calculates a load current based on the first sense current and the second sense current such that the effect of the input offset voltage in the current detection portion is cancelled.

7 Claims, 7 Drawing Sheets

CURRENT DETECTION CIRCUIT AND CURRENT DETECTION METHOD

BACKGROUND OF THE INVENTION

1. Field of the Invention

The present invention relates to a current detection circuit and a current detection method using a multi-source MOS transistor.

2. Description of Related Art

In recent years, electronic devices mounted in a vehicle have become diversified, and the number of such devices mounted in the vehicle has been increasing. When one of such electronic devices such as a headlamp or a brake lamp becomes unable to continue the normal operation owing to a broken wire or the like, it can lead to an accident. Therefore, mounting a detection device to detect a broken wire is indispensable, and it has been made obligatory by law. Furthermore, LEDs (Light Emitting Diodes), which have smaller current consumption than that of halogen lamps, have been taking the place of the halogen lamps for each of various lamps and the like. To detect a broken wire regardless of whether the connected load is a halogen lamp or a LED, it is important to accurately detect the load current flowing from the power device.

Japanese Unexamined Patent Application Publication No. 2003-28901 discloses a detection method of load current using a multi-source MOS transistor. FIG. 5 is a circuit to detect load current using the multi-source MOS transistor, and it is composed of the multi-source MOS transistor having a load MOS transistor and a detection MOS transistor, and a current detection circuit including an operational amplifier. By establishing a predetermined ratio between the on-resistances of the load MOS transistor and the detection MOS transistor and setting the on-resistance of the detection MOS transistor larger than that of the load MOS transistor, and using the fact that the voltage between the drain and the source of the detection MOS transistor is made substantially equal to that of the load MOS transistor by the operational amplifier, the current flowing through the current detection circuit is establish such that it has a predetermined ratio to the load current flowing through the load MOS transistor and the amount of it becomes very small. Therefore, the load current can be detected without having any adverse effect on the current consumption.

Since an operational amplifier is used as the current detection circuit in the load current detection circuit using the multi-source MOS transistor, it poses a problem that the accuracy is affected by the offset of the operational amplifier. Japanese Unexamined Patent Application Publication No. 2003-28901, as shown in FIG. 6, adds a MOS resistance changing means to the load current detection circuit using the. multi-source MOS transistor shown in FIG. 5 in an attempt to solve the problem relating to the offset of the operational amplifier. The MOS resistance changing means controls the on-resistances of the load MOS transistor and the detection MOS transistor such that the voltage drop by the load current at the load MOS transistor and the detection MOS transistor is maintained constant at all times. The offset of an operational amplifier has the maximum effect when the voltage drop at the load MOS transistor and the detection MOS transistor is small. Therefore, Japanese Unexamined Patent Application Publication No. 2003-28901 reduces the effect of the offset of the operational amplifier by controlling the gate bias voltage to the load MOS transistor and the detection MOS transistor, i.e., by controlling the amount of the voltage drop at the load MOS transistor and the detection MOS transistor. However, this method cannot completely cancel the offset.

Japanese Unexamined Patent Application Publication No. 2003-28901 further discloses a current detection method, like one shown in FIG. 7, in order to cancel the offset of the operational amplifier. Assume that the sense ratio of the detection MOS transistor and the load MOS transistor is 1: n, and the offset voltage of the operational amplifier is Voff. Then, the current flowing through the current detection circuit is measured twice, once for when the on-resistance of the load MOS transistor is set to Ron, and once for when it is set to 0.5 Ron. Assuming the load current is I, the current which is measured in twice is expressed in the following equations.

$Iout1 = (I \times Ron + Voff)/(n \times Ron)$ $Iout2 = (I \times 0.5 Ron + Voff)/(n \times 0.5 Ron)$ The load current I is expressed in the following equation from these two equations.

$I = (2 Iout1 - Iout2)/n$

That is, Japanese Unexamined Patent Application Publication No. 2003-28901 states that the load current for which the offset Voff is cancelled can be obtained from the calculation of two current measurements.

It also states that the load current for which the offset of the operational amplifier is cancelled can be detected by the current detection circuit shown in FIG. 7 of Japanese Unexamined Patent Application Publication No. 2003-28901. However, as can be seen from above-described two equations, it requires that the load current I should not be changed between the two current measurements for Iout1 and Iout2. If the load current I is changed between at the measurement for Iout1 and at the measurement for Iout2, it becomes very difficult to obtain the load current I from Iout1 and Iout2. In the case of Japanese Unexamined Patent Application Publication No. 2003-28901, since the measurements are carried out with different on-resistances of the multi-source MOS transistor (Ron and 0.5 Ron in the embodiment), the load current I is not necessarily the same between the measurements for Iout1 and Iout2 unless other conditions such as the power supply and the load are changed accordingly.

Furthermore, there is a possibility that the load current may be changed between the two current measurements for Iout1 and Iout2 simply owing to a broken wire in the device connected as the load or a similar condition. The measurement of the load current is unreliable in such cases. In such cases, it is necessary to take measures to determine the normality/abnormality of the measurement result, and to re-measuring Iout1 and Iout2 when the original measurement is determined to be abnormal, or similar measures.

SUMMARY

In accordance with one embodiment of the present invention, a current detection circuit includes: a multi-source MOS transistor having a sense MOS transistor and a load MOS transistor, the multi-source MOS transistor being connected to a power supply and a load; a current detection portion having a negative input offset voltage characteristic to detect sense current flowing through the sense MOS transistor, one input of the current detection portion being connected to the power supply or the load MOS transistor, and the other input of the current detection portion being connected to the sense MOS transistor; and a calculation control portion to calculate a load current flowing through the load based on the sense current detected in the current detection portion; wherein the calculation control portion calculates the load current based on a first sense current and a second sense current such that the effect of the input offset voltage in the current detection portion is cancelled, the first sense current being the sense current when the current detection portion is connected to the power supply, and the second sense current being the sense current when the current detection portion is connected to the load MOS transistor.

In accordance with one embodiment, the present invention can cancel the offset independent of the fluctuation of the load current in a current detection circuit using the multi-source MOS transistor, and is beneficial to higher detection accuracy of the load current.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention are explained hereinafter with reference to the drawings.

First Embodiment

Figure 1:
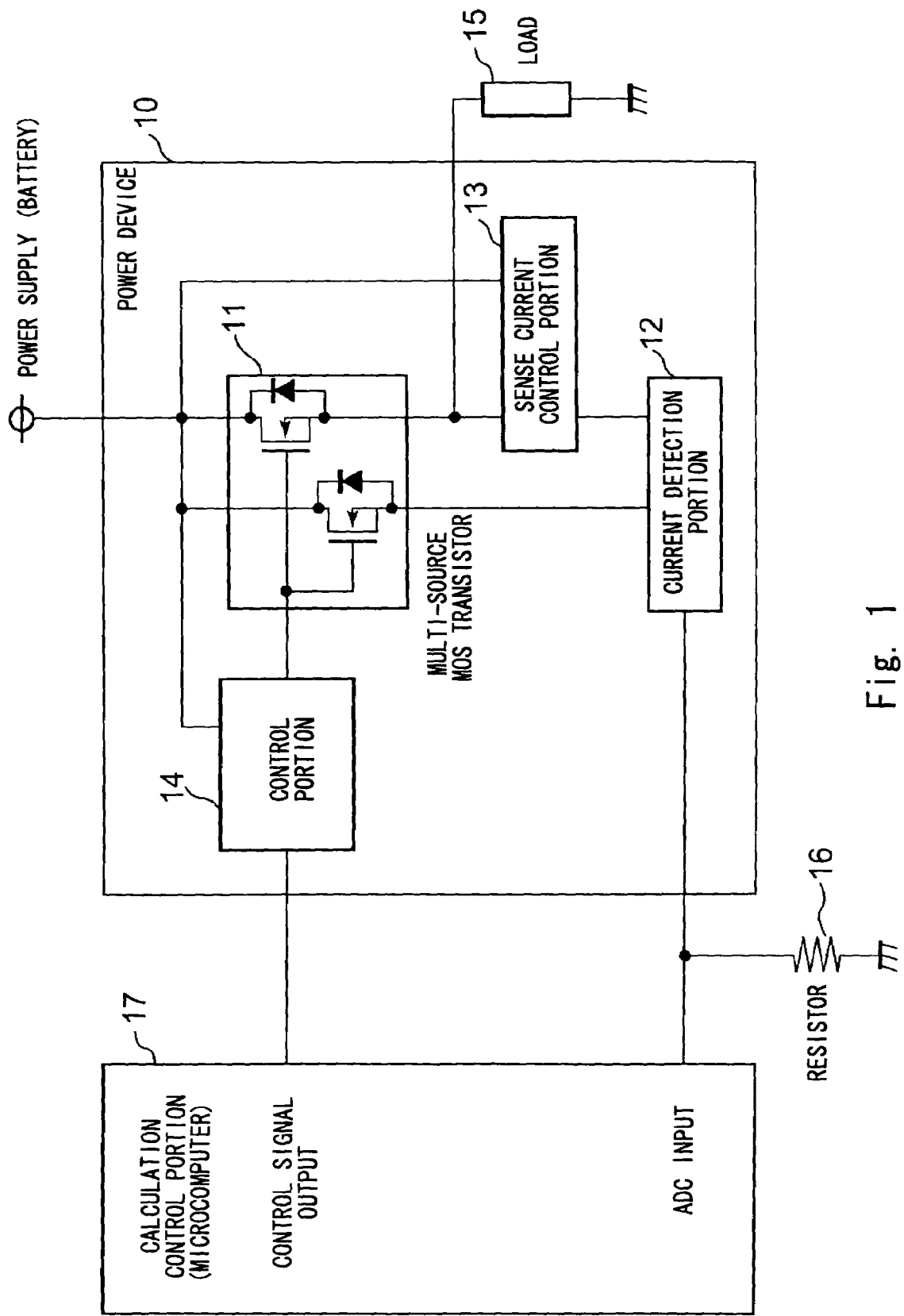
FIG. 1 is an overall view of a current detection circuit in accordance with a first embodiment of the present invention.

FIG. 1 is an overall view of a current detection circuit in accordance with a first embodiment of the present invention. The current detection circuit is composed of a power device 10 to drive a load 15 such as a lamp, a resistor 16 used to measure the load current flowing through the load 15 based on the current outputted from the power device 10, and a calculation control portion 17. The calculation control portion 17 is composed of a microcontroller or the like. The power device 10 includes a multi-source MOS transistor 11 located between the power supply and the load 15, and a sense current control portion 13 and a current detection portion 12 connected to the outputs of the multi-source MOS transistor 11. The details of them are explained later.

Figure 2:
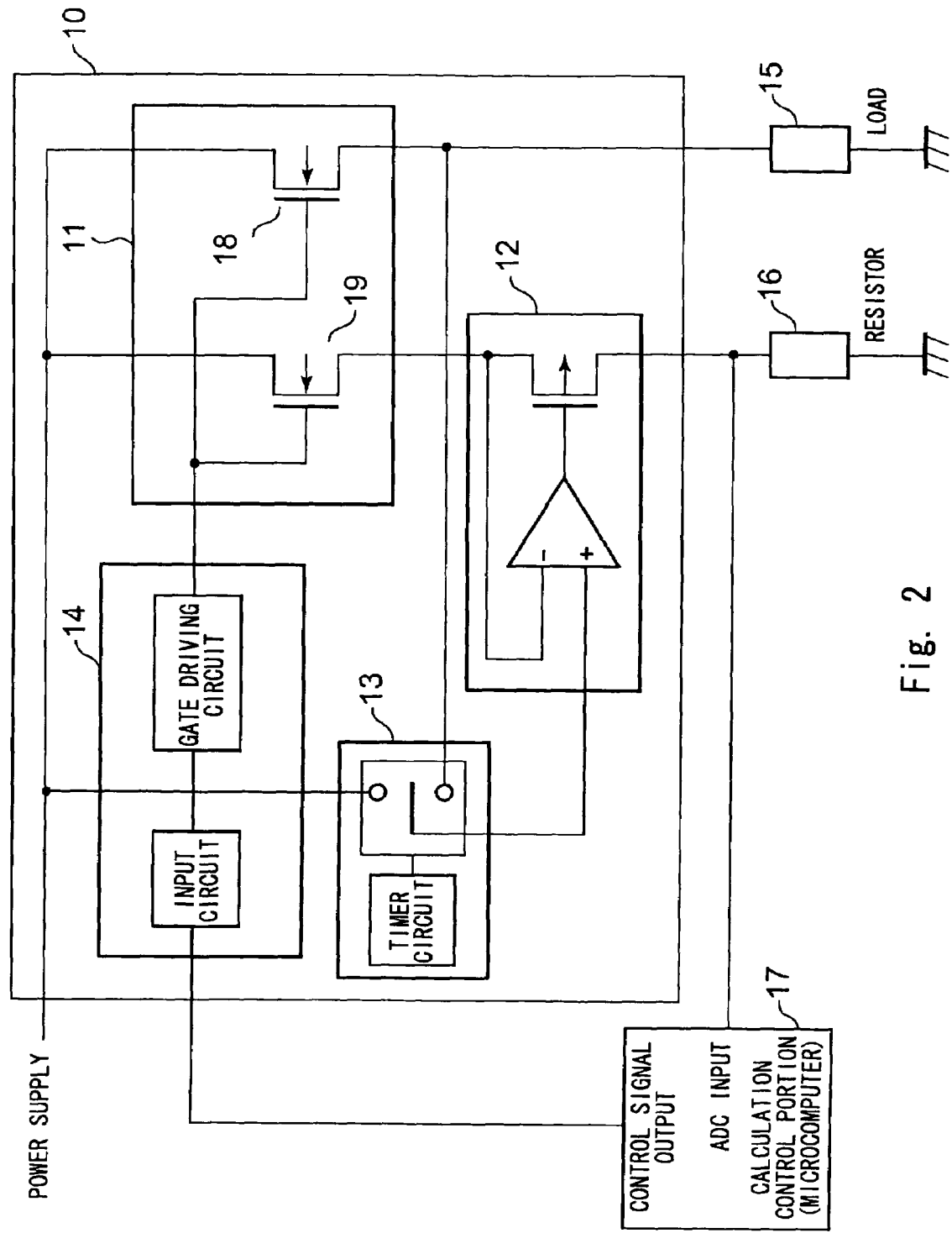
FIG. 2 is a detail view of a power device portion in accordance with the first embodiment of the present invention.

FIG. 2 is a detail view of the power device 10. The multi-source MOS transistor 11 controls power supply to the load 15 by a control signal from the calculation control portion 17. The multi-source MOS transistor 11 is composed of a load MOS transistor 18, which is an Nch-MOS transistor with the drain connected to the power supply and the source connected to the load 15, and a sense MOS transistor 19, which is also an Nch-MOS transistor with the drain connected to the power supply and the source connected to the current detection portion 12. The current detection portion 12 serves as a constant current circuit composed of an operational amplifier, the negative input side of which is connected to the source of the sense MOS transistor 19 and the positive input side of which is connected to the power supply or the source of the load MOS transistor 18. The connection to the positive input side of the operational amplifier is controlled by the sense current control portion 13. The sense current control portion 13 is composed of a timer circuit and a switch circuit.

Figure 3:
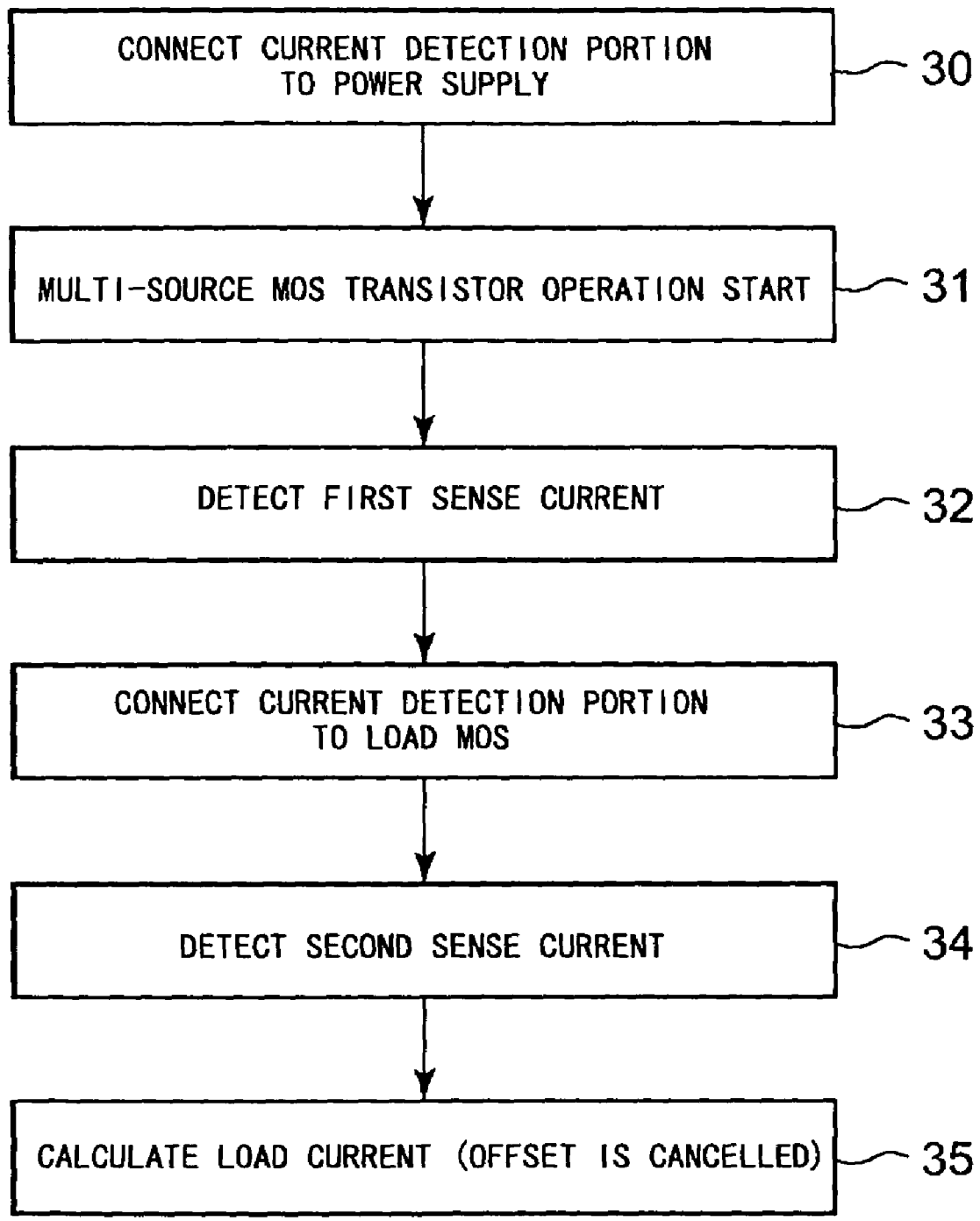
FIG. 3 is an operational flow diagram of a current detection circuit in accordance with the first embodiment of the present invention.

Next, the operation of the current detection circuit in accordance with first embodiment of the present invention is explained hereinafter with reference to FIGS. 2 and 3. In this embodiment, the sense ratio of the multi-source MOS transistor 11 (the ratio determined by the on-resistances of the load MOS transistor 18 and the sense MOS transistor 19) is established to 1/5000. As an example, assume that the on-resistance Ron1 of the load MOS transistor 18 is set to 20 mΩ, and the on-resistance Rons of the sense MOS transistor 19 is set to 100Ω. First, the sense current control portion 13 connects the positive input side of the operational amplifier of the current detection portion 12 to the power supply (Step 30). Next, the calculation control portion 17 instructs the power device 10 to start supplying power to the load 15 (Step 31). That is, voltage is applied to the gates of the load MOS transistor 18 and the sense MOS transistor 19, and the multi-source MOS transistor 11 starts operating.

The sense current control portion 13 includes the timer circuit. The timer circuit and the switch circuit use the control signal sent from the calculation control portion 17 as a trigger in order to connect the power supply to the positive input side of the operational amplifier for a predetermined time period. However, the control method is not limited to the one using the timer circuit. For example, the switch timing may be provided by an external control signal such as a control signal from the calculation control portion 17.

As the positive input side of the operational amplifier is connected to the power supply and the multi-source MOS transistor 11 starts operating, the current detection portion 12 operates such that the connection node to the sense MOS transistor 19 becomes the same potential as the power supply by the imaginary short of the operational amplifier. However, since an operational amplifier has input offset voltage (potential difference between the positive input side and the negative input side) owing to manufacturing variations, the effect of operating temperature, and the like, the potential at the connection node to the sense MOS transistor 19 is determined by the power supply and the input offset voltage. Assuming that the power supply potential VDD is 12 V, the operating voltage of the operational amplifier is also 12 V, and the operational amplifier has negative input offset voltage Voff of 5 mV, the potential at the connection node of the operational amplifier and the sense MOS transistor 19 is expressed by the equation VDD−Voff=12V−5 mV. The current flowing through the current detection portion 12, i.e., the sense current flowing through the sense MOS transistor 19 at this point is converted to voltage by the resistor 16 (e.g., 5 kΩ) and outputted to the calculation control portion 17. The calculation control portion 17 converts the inputted analog voltage value to a digital value, and further converts to a current value in order to obtain the current value flowing through the current detection portion 12. Then, the calculation control portion 17 stores the obtained current value (Step 32). The sense current I1 is expressed in the following equation.

$$I1 = Voff/Rons = 5\ mV/100\Omega = 50\ \mu A \quad (1)$$

Next, the sense current control portion 13 connects the positive input side of the operational amplifier of the current detection portion 12 to the source of the load MOS transistor 18 (Step 33). The load current I flowing through the load MOS transistor 18 is determined by the load 15. Assuming that the load current I is 50 mA in this embodiment, the voltage applied to the positive input side of the operational amplifier is expresses by the equation VDD−I×Ron1=12V−1 mV. By the effects of the imaginary short of the operational amplifier and the negative input offset voltage, the voltage at the connection node of the operational amplifier and the sense MOS transistor 19 is expressed by the equation VDD−I×Ron1−Voff=12V−6 mV. Therefore, the sense current value I2 at this point can be obtained from the following equation (Step 34).

$$I2 = (I \times Ron1 + Voff)/Rons = 6\ mV/100\Omega = 60\ \mu A \quad (2)$$

It can be seen that, in the above-mentioned equation (1), the current value I1 is determined by the input offset voltage, and does not depend on the load current I. By transforming the equations (1) and (2), the following equation is obtained.

$$I2 - I1 = I \times Ron1/Rons = 10\ \mu A$$

That is, it can be seen from the equation that (I2-I1) is a value in which the offset current caused by the input offset voltage is cancelled, and that 10 µA is a value corresponding to 1/5000 (i.e., sense ratio of the multi-source MOS transistor 11) of the load current 50 mA. Therefore, the calculation control portion 17 can obtain the load current I, for which the offset current caused by the input offset voltage Voff is cancelled, from the values I1 and I2 (Step 35).

The operational amplifier in the current detection portion 12 preferably has negative input offset voltage in the present invention. The reason for that is explained hereinafter. In the case where the operational amplifier has positive input offset voltage, the connection node of the current detection portion 12 and the sense MOS transistor 19 will be saturated at the operational voltage of the operational amplifier, i.e., at 12 V, when the positive input side of the operational amplifier is connected to the power supply. Consequently, since almost no sense current flows in such situation, the measurement of the above-described value I1 becomes very difficult. Therefore, the operational amplifier in the current detection portion 12 is preferably configured so as to have negative input offset voltage in the present invention.

Furthermore, the positive input side of the operational amplifier is preferably connected to the power supply during the measurement for the above-described sense current I1 in the present invention. By connecting the positive input side to the power supply, the sense current I1 becomes dependent on the offset of the operational amplifier. The effect of the offset will be reflected on the sense current I1 even if the positive input side is connected to the ground potential side. However, the voltage applied to the sense MOS transistor 19 is expressed as VDD−Voff in such case. Therefore, in the case where VDD>>Voff, the sense current I1 cannot be considered any longer to be dependent on the offset in such situation. Therefore, the positive input side is preferably connected to the power supply to improve the accuracy of the offset cancelling.

Second Embodiment

Figure 4:
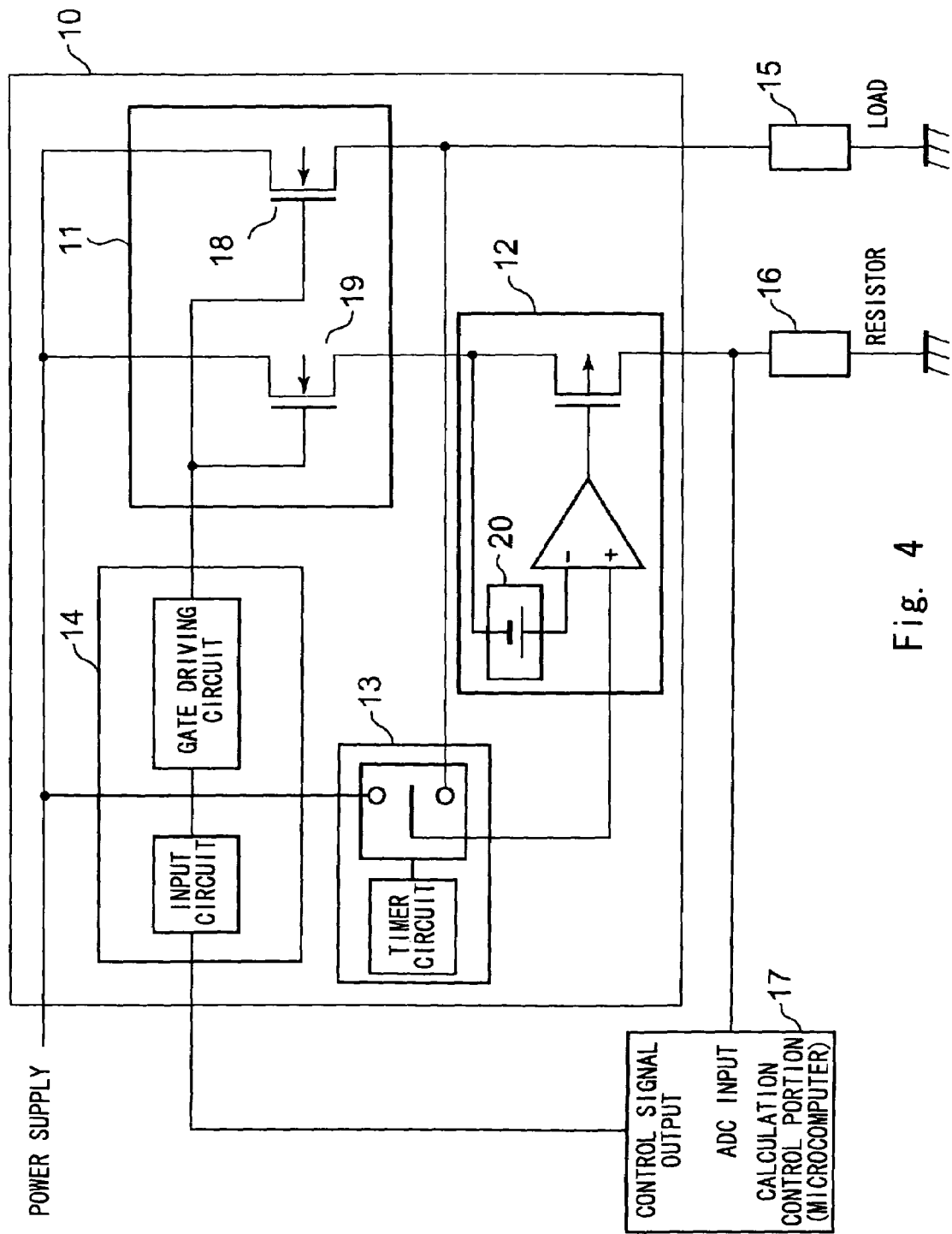
FIG. 4 shows a current detection circuit in accordance with a second embodiment of the present invention.
Figure 5:
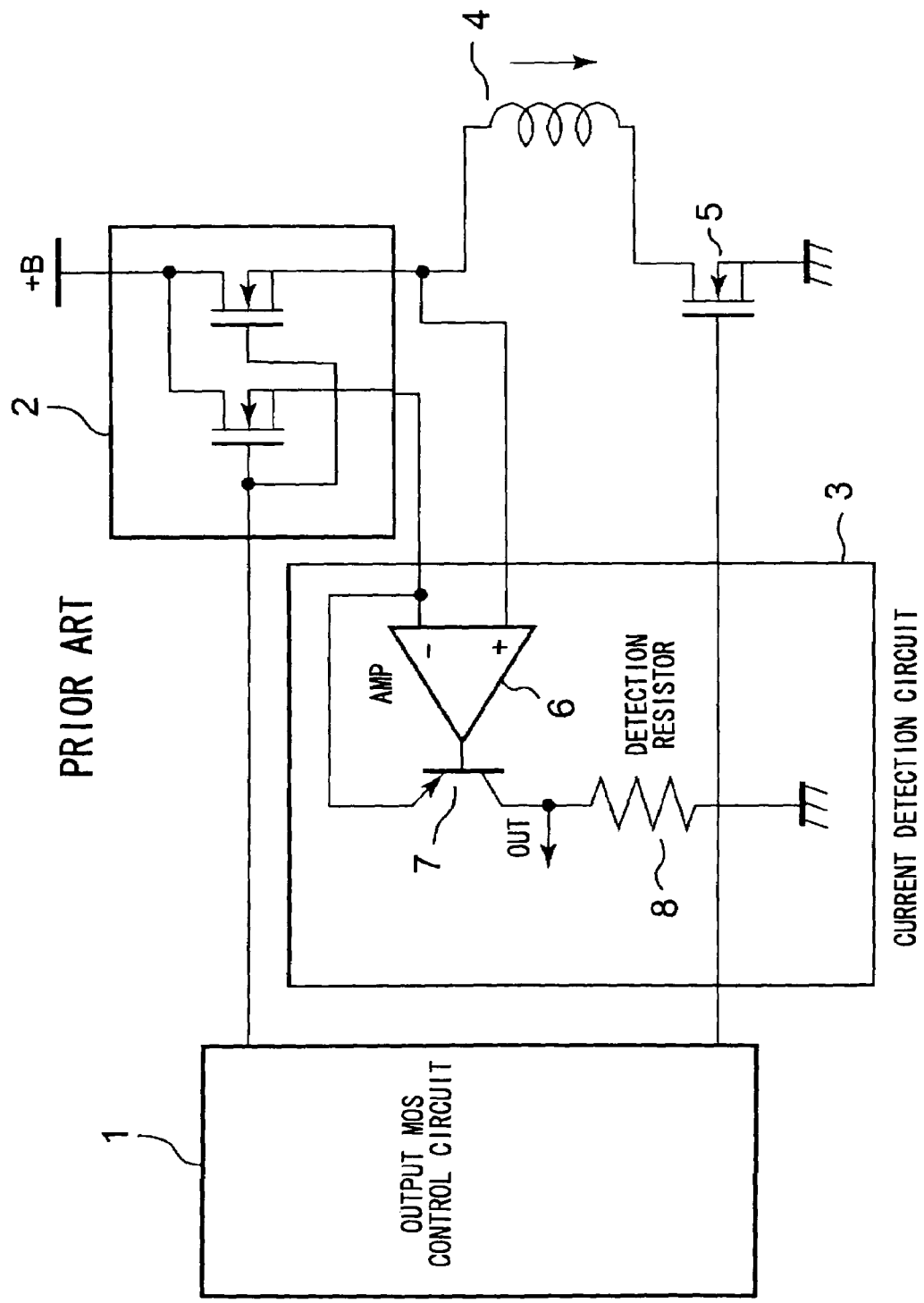
FIG. 5 is a current detection circuit in the related art.
Figure 6:
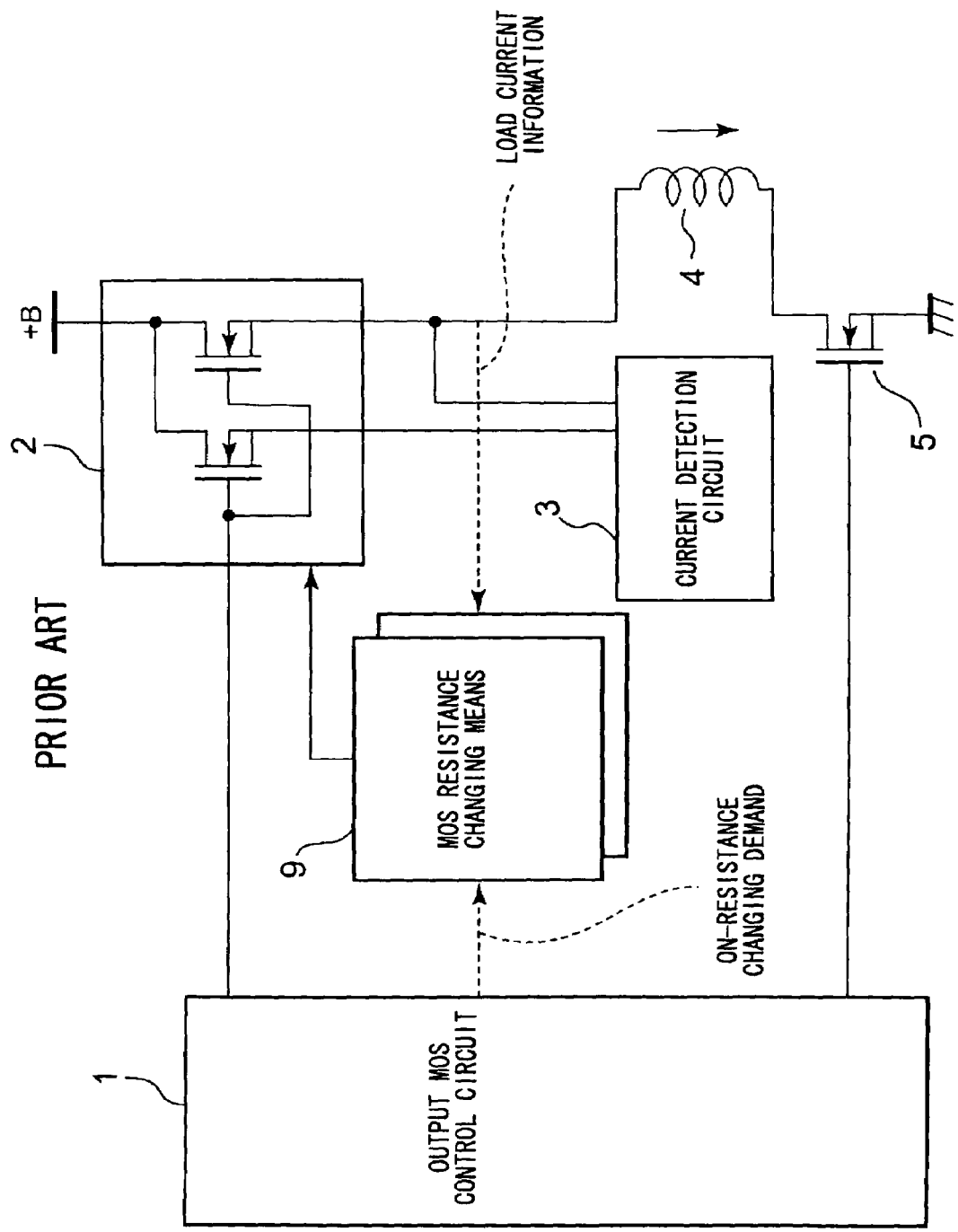
FIG. 6 is a current detection circuit in the related art.
Figure 7:
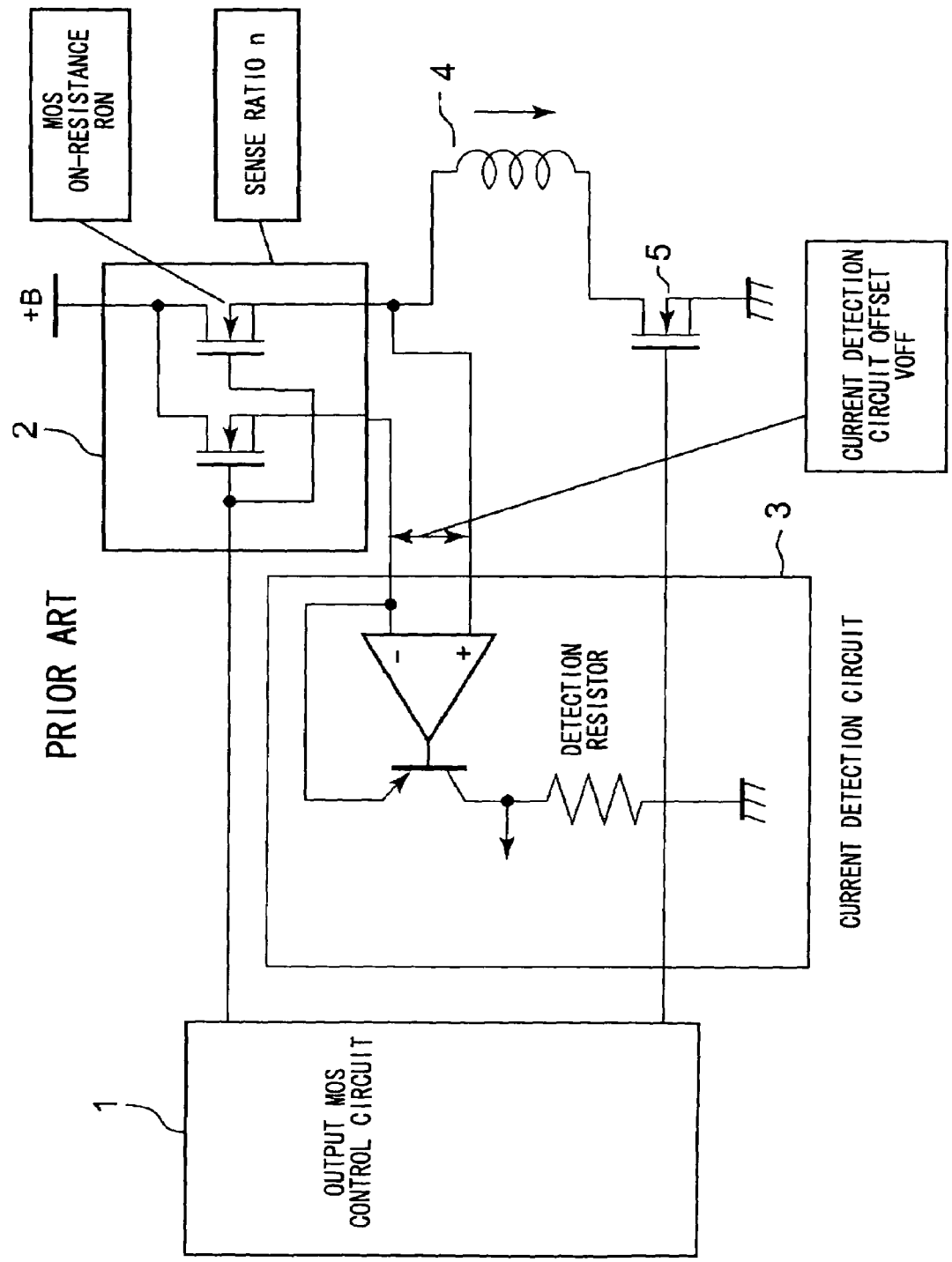
FIG. 7 is a current detection circuit in the related art.

FIG. 4 is a current detection circuit in accordance with a second embodiment of the present invention. The second embodiment is different from the first embodiment in that the current detection portion 12 includes a constant power supply portion 20. The constant power supply portion 20 is configured such that the operational amplifier in the current detection portion 12 has always negative input offset voltage. In the case where it is known in advance that the input offset voltage characteristic of the operational amplifier falls within, for example, the range of ±5 mV from manufacturing conditions or the other conditions, the operational amplifier can always have negative offset voltage by arranging the constant power supply portion 20 with voltage Vf in the order of 10 mV on the negative input side of the operational amplifier. The operation of the current detection portion 12 of the second embodiment is substantially the same as that of the first embodiment. In particular, the offset voltage Voff is replaced by voltage higher than the voltage Voff by the amount corresponding to the potential of the constant power supply portion 20, i.e., voltage Voff+Vf. Then, the current values I1 and I2 are calculated, and the load current I is obtained.

Although there is a possibility that the offset current may increase in the current detection portion 12 in the second embodiment in comparison with the case where the constant power supply portion 20 is not arranged, it can obtain the load current I, for which the offset is cancelled, independent of the fluctuation of the input offset voltage of the operational amplifier.

It is apparent that the present invention is not limited to the above embodiment but may be modified and changed without departing from the scope and spirit of the invention.

What is claimed is:

1. A current detection circuit comprising:
   a multi-source MOS transistor having a sense MOS transistor and a load MOS transistor, the multi-source MOS transistor being connected to a power supply and a load;
   a current detection portion having a negative input offset voltage characteristic to detect sense current flowing through the sense MOS transistor, one input of the current detection portion being connected to the power supply or the load MOS transistor, and the other input of the current detection portion being connected to the sense MOS transistor; and
   a calculation control portion to calculate load current flowing through the load based on a first sense current and a second sense current such that the effect of the input offset voltage is cancelled, the first sense current being the sense current when the current detection portion is connected to the power supply, and the second sense current being the sense current when the current detection portion is connected to the load MOS transistor.

2. The current detection circuit according to claim 1, wherein the current detection portion is a constant current circuit including an operational amplifier, and the positive input of the operational amplifier is connected to one of the power supply or the load MOS transistor and the negative input of the operational amplifier is connected to the sense MOS transistor.

3. The current detection circuit according to claim 2, further comprising a constant power supply portion arranged between the negative input of the operational amplifier and the sense MOS transistor such that the operational amplifier has a negative offset voltage characteristic.

4. The current detection circuit according to claim 1, further comprising a sense current control portion, wherein the sense current control portion connects one input of the current detection portion to the load MOS transistor or the power supply based on a control signal.

5. The current detection circuit according to claim 4, wherein the sense current control portion includes a timer circuit and a switch circuit, and the control signal is generated at a predetermined timing by the timer circuit.

6. The current detection circuit according to claim 1, wherein the calculation control portion is a microcontroller.

7. A method of detecting load current flowing a load using:
  a multi-source MOS transistor having a sense MOS transistor and a load MOS transistor, the multi-source MOS transistor being connected to a power supply and the load; and
  a current detection portion having a negative input offset voltage characteristic;

the method comprising:

connecting the current detection portion to the sense MOS transistor and the power supply, and detecting a first sense current;

connecting the current detection portion to the sense MOS transistor and the load MOS transistor, and detecting a second sense current; and calculating the load current based on the first sense current and the second sense current such that the effect of the input offset voltage is cancelled.

* * * * *